United States Patent
Chen et al.

(10) Patent No.: US 6,220,084 B1
(45) Date of Patent: Apr. 24, 2001

(54) DETECTING FIELDS WITH A SINGLE-PASS, DUAL-AMPLITUDE-MODE SCANNING FORCE MICROSCOPE

(75) Inventors: Dong Chen; Edwin Flecha; James Michael Hammond; Kenneth Gilbert Roessler, all of Boca Raton, FL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/606,623

(22) Filed: Jun. 29, 2000

Related U.S. Application Data (62) Division of application No. 09/226,830, filed on Jan. 7, 1999, which is a division of application No. 08/867,136, filed on Jun. 2, 1997, now Pat. No. 5,918,274.

(51) Int. Cl.[7] ........................................... G01B 7/34
(52) U.S. Cl. .................................................. 73/105
(58) Field of Search .............................. 73/105; 250/306, 250/307

(56) References Cited

U.S. PATENT DOCUMENTS

| | | | |
|---|---|---|---|
| 4,724,318 | * | 2/1988 | Binnig ................................ 250/306 |
| 4,954,704 | * | 9/1990 | Elings et al. ..................... 250/307 |
| 5,338,932 | * | 8/1994 | Theodore et al. ............... 250/306 |
| 5,416,327 | * | 5/1995 | Weiss et al. ....................... 250/307 |
| 5,418,363 | * | 5/1995 | Elings et al. ................. 73/105 X |
| 5,481,908 | * | 1/1996 | Gamble ............................... 73/105 |
| 5,507,179 | * | 4/1996 | Gamble et al. .................... 73/105 |
| 5,646,339 | * | 7/1997 | Bayer et al. ....................... 73/105 |
| 5,700,953 | * | 12/1997 | Hlady et al. ....................... 73/105 |
| 5,723,775 | * | 3/1998 | Watanabe et al. ................ 73/105 |
| 5,729,015 | * | 3/1998 | Tong ............................ 73/105 X |
| 6,094,971 | * | 8/2000 | Edwards et al. .................. 73/105 |
| 6,145,374 | * | 11/2000 | Niechonski et al. .............. 73/105 |

\* cited by examiner

*Primary Examiner*—Thomas P. Noland
(74) *Attorney, Agent, or Firm*—Richard A. Tomlin; Ronald V. Davidge (57) ABSTRACT

A scanning probe microscope operates in the manner of an atomic force microscope during intermittent periods of scanning motion, in which a sample surface is driven so that a scan line on the surface is moved past a probe tip being vibrated in engagement with the surface. Between these intermittent periods of scanning motion, the vibrating probe tip is moved out of engagement with the sample surface, so that the amplitude and phase shift of probe tip vibrations are determined by the gradient of a force field extending outward from the sample surface. Such a force field is established when the probe tip is attracted by, or repelled from, a magnetic or electric field at or near the sample surface. For each sample point, the system stores data representing the height of the sample surface and the force field.

6 Claims, 3 Drawing Sheets

DETECTING FIELDS WITH A SINGLE-PASS, DUAL-AMPLITUDE-MODE SCANNING FORCE MICROSCOPE

CROSS-REFERENCE TO RELATED APPLICATIONS

This is a division of Application Ser. No. 09/226,830, filed Jan. 7, 1999, which is a division of Application Ser. No. 08/867,136, filed Jun. 2, 1997, which has issued as U.S. Pat. No. 5,918,274.

This application is related to a U.S. application, Ser. No. 08/867,138, filed Jun. 2, 1997, which has issued as U.S. Pat. No. 5,902,928, which describes the use of a segmented bimorph piezoelectric actuator to provide movement, in accordance with a plurality of input signals, to the proximal end of a cantilever having a probe tip at its distal end. In an embodiment of this application used as an atomic force microscope, an individual probe segment is used for the application of vibration excitation.

This application is also related to a copending U.S. application, Ser. No. 08/867,137, filed Jun. 2, 1997, which has issued as U.S. Pat. No. 5,907,096, which describes the use of a scanning force microscope driven in first and second passes along a scan line, with topographical features of a sample surface being determined during a first scan as an atomic force microscope, and with a magnetic or electric field being measured during the second pass. Topographical data from the first pass is used to move a probe tip at a constant displacement from the sample surface during the second pass, in which contact between the probe tip and the sample surface is prevented by reducing the amplitude of tip vibrations.

BACKGROUND OF THE INVENTION

1. Field of the Invention

This invention relates to a method for measuring magnetic or electric fields within a sample material and, more particularly, to a method using a scanning force microscope to track the topography of the surface so that such fields occurring close to the material surface are accurately measured at a small, constant distance from the surface.

2. Background Information

The measurement of a magnetic or electric field occurring within a sample material, from a measurement point traversing the surface of the material at a very close spacing beyond this surface, has been a subject of an ongoing effort by scanning probe microscopy researchers for several years. A measurement process of this type requires that a probe sensitive to magnetic or electric fields must be moved in a direction perpendicular to the sample surface during the traversing, or scanning process, so that the probe tracks the topography of the sample surface without contacting it. Moving the probe in this way is both important and difficult when the sample surface is quite rough, as is the surface of a number of materials for which this type of measurement can provide significant information, such as the surfaces of magnetic data storage media.

The scanning force microscope provides an accurate method for moving a probe along a surface in very close proximity thereto. A probe having a very sharp tip is moved along the sample surface being examined by means of a lateral actuator. The probe is mounted to a distal end of a cantilever, the proximal end of which is attached to a vertical actuator, which moves the probe tip into and out of engagement with the sample surface. Vibration in this vertical direction is applied to the distal end of the cantilever through the vertical actuator at a frequency close to the resonant frequency of the cantilever. The vibration of the probe tip at this frequency is measured. As topographical features of the sample surface increase the engagement of this surface with the probe tip, the probe tip vibration is decreased. As this engagement is decreased, the probe tip vibration increases up to a point at which the probe is freely vibrating out of contact with the sample surface. A feedback signal is generated as a difference between a signal representing probe tip vibration and a setpoint signal representing a level of vibrations occurring with the operational level of engagement desired between the probe tip and the sample surface. This feedback signal is used within a servomechanism loop including the vertical actuator to maintain the engagement at this operational level during lateral scanning.

However, when a single probe is used to track the surface topography, with a method such as that of the scanning force microscope, and simultaneously to track magnetic or electric fields, the signals produced by changes in topography tend to become mixed with the signals caused by these fields, so that accurate information cannot be recovered. What is needed is a way for separating the measurement of topography from the measurement of a field, while moving the probe in response to topographical variations during field measurements.

DESCRIPTION OF THE PRIOR ART

U.S. Pat. No. 4,724,318 describes an atomic force microscope, in which a sharp point is brought so close to the surface of a sample to be investigated that the forces occurring between the atoms as the apex of the point and those at the surface cause a spring-like cantilever to deflect. The cantilever forms one electrode of a tunneling microscope, the other electrode being a sharp tip. The deflection of the cantilever provokes a variation of the tunnel current, and that variation is used to generate a correction signal which can be employed to control the distance between the point and the sample, in order, for example, the force between them constant as the point is scanned across the surface of the sample by means of an xyz-drive, with the sample being driven in a raster scan in the xy-plane. In certain modes of operation, either the sample or the cantilever may be excited to oscillate in the z-direction. If the oscillation is at the resonance frequency of the cantilever, the resolution is enhanced. Using this method, a topographical image of a sample surface having a resolution better than 100 nanometers may be obtained by employing the following steps: A sharp point which is fixed to one end of a spring-like cantilever is brought so close to the surface of the sample to be inspected that the forces occurring between the point and the sample surface are larger than $10^{-20}$ Newton, so that the resulting force deflects the cantilever. The deflection of the cantilever is detected by means of a tunnel tip disposed adjacent the cantilever. The tunnel current then flowing across the gap between the cantilever and tunnel tip is maintained at a constant value by using any detected variations of the tunnel current to generate a corrections signal. The correction signal is used, among other things, to maintain the point-to-sample distance constant.

Several methods have been developed for separating the measurement of surface topography from the simultaneous measurement of magnetic and electric fields. For example, D. Ruger, et al., writing in the *Journal of Applied Physics*, Vol. 68(3)., page 1169 in 1990, describe the measurement of magnetic forces by applying an additional direct current bias of 0 to 10 volts between the probe and the sample. This electrical bias provides an attractive electrostatic force gradient which is only a function of the distance between the probe and the sample surface. This attractive electrostatic force combines with the magnetic forces to be measured, which vary along the sample surface, to form an overall attractive force gradient that increases in magnitude as the probe approaches the surface. This additional attractive force assures that the overall force remains attractive, so that the servo loop keeping the probe tracking above the sample surface is stabilized, despite the fact that magnetic forces may be either attractive or repulsive.

However, the contours of the constant-force gradient measured in this way do not necessarily reflect only a level of magnetic contrast, due to the dependence of the non-magnetic contrast on the distance between the probe tip and the sample surface. That is, if the force gradient of the non-magnetic force is a nonlinear function which is comparable in magnitude to the measured magnetic force gradient, then the resulting vertical-axis response of the apparatus to the magnetic force gradient is also nonlinear. Furthermore, when this method is used on a rough surface, the distance between the probe tip and the surface must be relatively large to avoid the contamination of the magnetic-force gradient map with topographical data. When this distance is large, the spatial resolution and signal-to-noise ratio of the magnetic force measurements are decreased.

Another method for separating the simultaneously-occurring signals caused by responses to variations in topography and magnetic fields is the use of modulation technology, as described by Martin and Wickramasinghe, in *Applied Physics Letters*, vol. 50, page 1455, in 1987, and by Schonenberger et al. in the *Journal of Applied Physics*, Vol. 67, page 7278, in 1990. With this technique, for example, adding an AC modulation signal to the applied DC bias causes a second-harmonic oscillation of the cantilever. The amplitude of this oscillation is used to drive a feedback loop adjusting the separation between the probe tip and the sample surface. While the vertical (Z-direction) movement of a piezoelectric actuator required to hold the tip vibration amplitude at a pre-determined value is used, in the manner of a conventional scanning force microscope, to provide an indication of the surface topography, the DC force is measured by detecting quasi-static deflections of the cantilever, as indicated by variations in the difference between the deflection of the probe tip and the movement of the actuator. A disadvantage of this method lies in the difficulty of measuring these quasi-static deflections in a manner providing an accurate depiction of the underlying electric or magnetic field. Such deflections are not easily measured with the accuracy available through the use of AC methods depending on changes in the amplitude of vibrations occurring at a frequency near the resonate frequency of the cantilever.

Another method for measuring magnetic fields, or other non-topographical features of a sample, is described in U.S. Pat. No. 5,418,363. This method employs a first pass of the probe along a scan line on the surface of the sample to determine its topography by conventional means, such as by the method of atomic force microscopy. During this first pass, the topographical data is stored. In a second pass, the sample surface is scanned along the same line, with this stored topographical data being used to ensure that the probe is at all times displaced from the sample surface by a pre-determined offset distance.

In an embodiment of such apparatus configured to measure magnetic fields, a probe incorporates a magnetic tip, and the first scan is provided using the method of an atomic force microscope. During the second scan, the magnetic tip is maintained above the surface of the sample to allow the measurement of magnetic forces in the sample. During this second scan, the deflection of the cantilever, may be measured directly by a detector, or the cantilever may be vibrated near resonance, with the resulting amplitude or phase of vibration being measured by a detector.

An example of measurements made with such apparatus is given by Y. E. Strausser et al., in *American Laboratory*, May, 1994, is a measurement of the topography and magnetic force gradients of the surface of a hardfile disk. In this example, the topography had variations of 120 nm peak-to-peak. The tip followed this topography, but at a displacement 100 nm above the surface.

In an embodiment of such apparatus configured to measure electric fields, the apparatus includes a conducting tip, with the first scan being performed as either an atomic force microscope or a scanning tunneling microscope. During the second scan, a voltage source provides for a voltage differential between the tip and the sample. In this way, an electric field is developed between the tip and the sample, indicating, for example, if the sample is an integrated circuit, the presence of various circuit elements below the surface.

What is needed is a method eliminating the need to move the center of vibrations away from the sample surface during the measurement of the magnetic or electric field, so that the spacial resolution and signal-to-noise ratio of the field measurements is not degraded. Also, to speed the measurement process, what is needed is a way to measure both topographical features and the magnetic or electric field during a single pass.

The use of a vibrating probe to measure gradients within a force field has been described by R. Wiesendanger in *Scanning Probe Microscopy and Spectroscopy—Methods and Applications*, Cambridge University Press, 1994, on pages 241–243. In such a field, the effective spring constant is given by:

$$c_{\mathit{eff}} = c - F' \text{ where } F' = \frac{\partial F_z}{\partial z}$$

In the above equation, c is the spring rate of the cantilever in the absence of a force field, and $C_{\mathit{eff}}$ is the effective spring rate of the cantilever in the presence of the force field. In an attractive force field, with the probe tip being attracted to the surface, the cantilever is effectively softened. In a repulsive force field, with the probe tip being repelled by the surface, the cantilever is effectively stiffened.

The change in the resonant frequency of vibrations of the cantilever/mass system is given by:

$$\omega = \sqrt{\frac{c_{\mathit{eff}}}{m}} = \omega_0 \sqrt{1 - \frac{F'}{c}}$$

In the above equation, m is an effective mass, and $\omega_0$ is the resonant frequency of the system in the absence of a force gradient.

Various methods for making a probe tip suitable for the measurement of magnetic forces under the conditions of non-contact force microscopy are described by R. Wiesendanger, ibid, pages 253–256. A first example of a magnetic force sensor is a cantilever with an integrated tip formed by electrochemical etching of a thin nickel, iron, or cobalt wire. After the wire is etched, it is bent at its distal end to form a tip. Alternately, a non-magnetic tip, composed of a material such as tungsten, after surface preparation by electrochemical etching, is coated with a thin layer, typically 50 nm, of ferromagnetic material, either by sputtering or by galvanic deposition. This layer is magnetized after deposition. A magnetic tip coating technique has also been applied to microfabricated silicon cantilevers, which may be built to provide specific properties based on a choice of coating material and thickness.

SUMMARY OF THE INVENTION

A first objective of the present invention is a method for determining both topographical features and data descriptive of a magnetic or electric field extending from a sample surface in a single pass along the surface with a scanning probe.

A second objective of the present invention is to provide a method for reducing the distance between the center of vibration of a probe during the measurement of a magnetic or electric field, so that the spatial resolution and signal-to-noise ratio of such a measurement can be improved.

In accordance with one aspect of the present invention, there is provided apparatus for measuring topographical features of a sample surface and a force field extending outward therefrom. The apparatus includes a cantilever, lateral drive means, vertical drive means, excitation drive means a vibration detector, control means, and data storage means. The probe tip is mounted at a distal end of a cantilever. The lateral drive means creates intermittent relative scanning motion between the probe tip and the sample surface, along a scan line on the sample surface, wherein the probe tip and the sample surface are held during a sampling period with the probe tip adjacent each sampling point within a plurality thereof along the scan line, between the relative scanning motion along the scan line. The vertical drive means causes relative motion between the probe and the sample surface along a Z-axis perpendicular to the sample surface, in accordance with a position signal applied to the vertical drive means. The excitation drive means vibrates a proximal end of the cantilever. The vibration detector detects amplitudes of vibrations of the probe tip. The control means generates the position control signal in accordance with a correction signal determined from an output of the vibration detector to maintain a constant level of engagement between the probe tip and the sample surface during the relative scanning motion, with the control means generating the position control signal and operating the excitation drive means to vibrate the probe tip out of engagement with the sample surface during each the sampling period. The data storage means stores for each the sampling point, a first value determined from the position control signal with the probe being vibrated in engagement with the sample surface, and a second value determined from an output of the vibration detector with the probe being vibrated out of engagement with the sample surface, with the first value indicating a topographical level of the sample surface, and with the second value indicating a condition of the force field.

A force field extending outward from the sample surface is established when the probe tip is attracted toward, or repelled from, the surface of the sample as a result of conditions at or near this surface. For example, a magnetized probe tip encounters a force field as it is moved adjacent the surface of a sample having magnetized regions. Such regions may form a pattern of magnetically recorded data. If an electrical potential is applied to a probe tip, it encounters a force field as it is moved adjacent the surface of a sample having electrically charged areas. Such a force field typically has an associated gradient in the Z-direction, extending outward from the sample surface, with the force between the sample and the probe becoming stronger as the surface is approached.

Thus, the vibrating probe tip is held in engagement with the sample surface during lateral motion between sample points. This type of engagement means that the device operates in the manner of an atomic force microscope, with the short range repulsive force acting between the probe tip and the sample surface determining the amplitude of probe tip vibration, and with the position about which such vibrations are centered being controlled through a servo system so that a constant amplitude of tip vibration, and hence a constant amplitude of vibration of the probe tip 14 is maintained. At each sample point, the probe tip 14 is vibrated out of engagement with the sample surface, so that the amplitude of vibration of the probe tip, and the phase angle between the probe tip vibration and the excitation function from which it is generated, are determined by the gradient of the force field. At each sample point, the probe tip vibration, is evaluated, in terms of its amplitude or in terms of its phase angle relative the excitation signal causing the vibration, to determine the local force field gradient.

DESCRIPTION OF THE INVENTION

Figure 1:
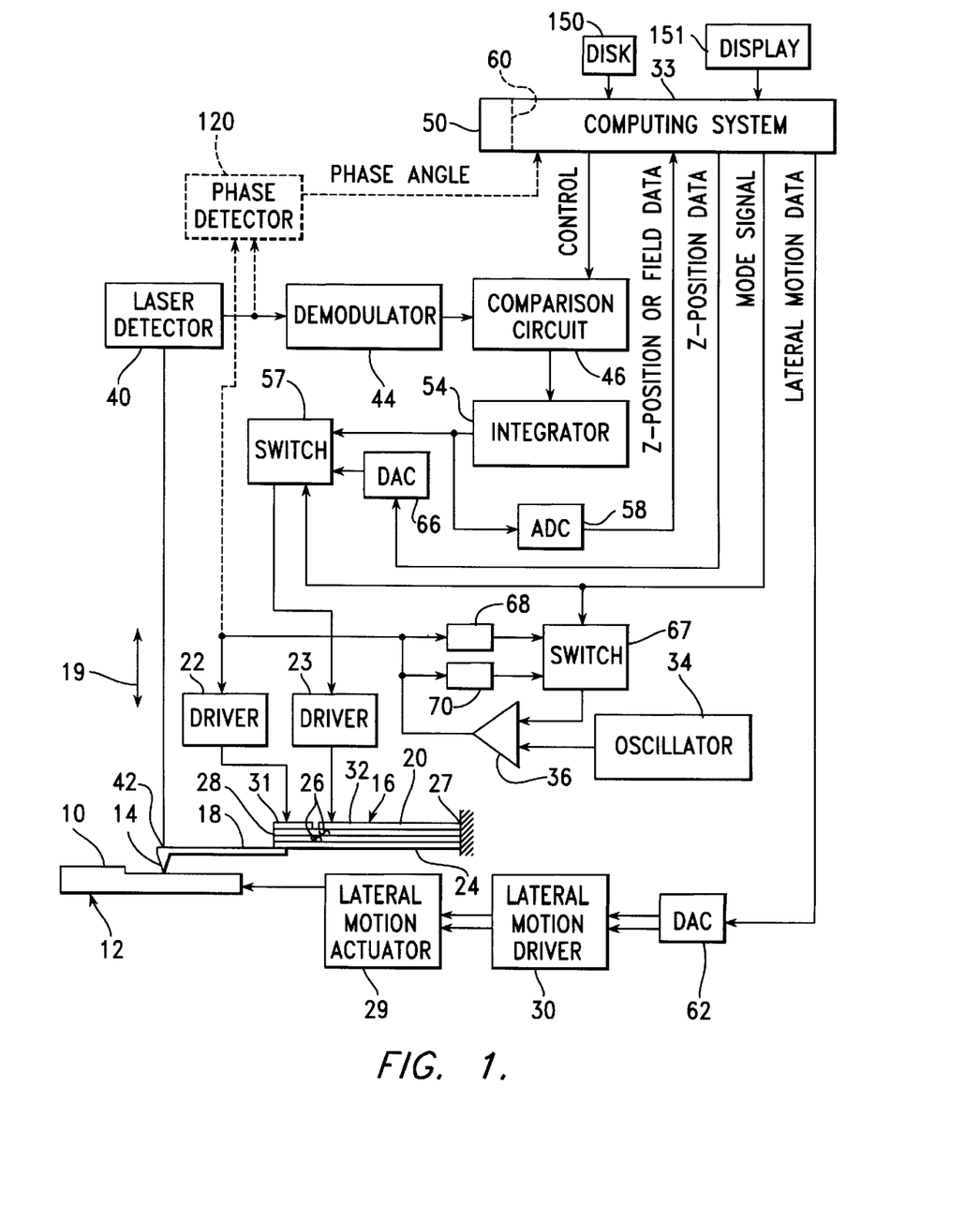
FIG. 1 is schematic view of apparatus built in accordance with the present invention.

FIG. 1 is a schematic view of apparatus built in accordance with the present invention. In this apparatus, both the topographical characteristics of a surface 10 of a sample 12 and the magnetic field extending outward from the surface 10 are measured by means of a probe tip 14, which is attached to a bimorph piezoelectric actuator 16 through a cantilever 18. The probe tip 14 is moved into and out of engagement with the sample surface 10, in the directions of arrow 19, as voltage signals are applied to upper electrode 20 of the bimorph piezoelectric actuator by means of driver circuits 22, 23, with the lower electrode 24 thereof being maintained at electrical ground. The actuator 16 includes a pair of strips 26 of piezoelectric material extending between the electrodes 20, 24. The proximal end 27 of the actuator 16 is clamped, while the distal end 28 thereof is fastened to the cantilever 18. The sample 12 is moved in a pattern of lateral scanning motion parallel to the surface 10 by means of a lateral motion actuator 29, operating in response to voltages applied by a lateral motion driver 30.

In the example of FIG. 1, the upper electrode 20 is segmented, being divided along a transverse line into a vibration excitation segment 31, to which a vibration excitation signal is applied by driver circuit 22, causing the probe tip 14 to vibrate, and a position control electrode segment 32, to which a position control signal is applied by driver circuit 23, causing the probe tip 14 to follow topographical features of the sample surface.

While the method shown and discussed herein provides for vertical motion of the probe tip 14 and lateral motion of the sample 12, it is understood that it is the relative motion between the tip and sample which must be controlled. For example, both the vertical and lateral motion may be applied to the probe tip 14 as it is moved relative to a stationary sample.

In operation with a single pass occurring according to the present invention, the sample 12 is moved in an intermittent motion along a scan line including a number of stopping points, where data samples are to be taken. While lateral movement of the sample 12 along the scan line occurs, the apparatus functions as an atomic force microscope, moving the probe tip at a constant distance above the sample surface 10 by responding to its topographical features along the scan line. At each sample point, lateral motion of the sample 12 is stopped, a topographical measurement indicating the height of the sample surface is stored, and the vertical motion of the probe tip is altered so that a predetermined clearance is maintained between the vibrating probe tip and the sample surface 10. In this condition, with the probe tip vibrating out of contact with the sample surface 10, and with the lateral motion stopped, a measurement of a force field gradient is made. Thus, the operation of the scanning probe as an atomic force microscope with lateral motion between sample points facilitates the safe movement of the probe tip between sample points, avoiding the establishment of crash conditions between the probe tip and the sample surface by moving with topographical changes, and moves the probe tip into a pre-determined spacing above the surface at the next sample point, where measurements of topographical height and magnetic field gradient are made.

A computing system 33 controls operation of this apparatus during both lateral movement of the sample 12 and when the sample 12 is stopped to measure a force field gradient, generating a MODE SIGNAL to indicate whether lateral movement or force field gradient measurement is currently being performed. During both lateral sample movement and force field gradient measurement, the probe tip 14 is caused to vibrate in the vertical directions of arrow 19 by the application of a vibrational excitation signal from an oscillator 34 to the excitation driver circuit 22. This signal is applied through a variable-gain amplifier 36. During both lateral sample movement and force field gradient measurement, the oscillator 34 preferably causes vibration of the actuator 20 at a frequency near the resonant frequency of the cantilever 18, which is typically between 100 KHz and 1 MHz.

During both lateral movement and force field gradient measurement, the motion of probe tip 14 is measured by a laser detector 40, which uses interferometry to develop a motion signal indicating the movement of the probe tip 14. This output is based on the movement of a reflective surface 42 moving with the probe tip 14. This output signal is provided as an input to a demodulator 44, which in turn provides an output describing the amplitude of probe tip vibration at the frequency of oscillator 34, as measured by the laser detector 40. During lateral movement of the sample 12, the output of demodulator 44 is in turn used as an input to a comparison circuit 46. The other input to comparison circuit 46 is a control signal voltage provided from the computing system 33.

During lateral movement of the sample 12, as the distance between probe tip 14 and the sample surface 10 is decreased, the amplitude of vibrations at the tip 14 decreases. As this distance is increased, this amplitude increases, up to an amplitude occurring with free vibration of the probe tip 14 in an absence of contact with the sample surface 10. In a useful range of engagement between the tip 14 and the surface 10, this effect is controlled by short range repulsive forces acting between the tip 14 and the surface 10.

Also during lateral movement of the sample 12, the vertical piezoelectric actuator 16 is preferably used to maintain the distance between the probe tip 14 and the sample surface 10 within a pre-determined range, causing the probe tip 14 to move upward and downward with changes in the topography of the sample surface 10, as these changes are encountered through the lateral scanning motion of the sample 12. To move the probe tip 14 in the vertical directions of arrow 19 in order to compensate for such changes in the topography of sample surface 10, the comparison circuit 46 generates a correction signal which is a difference between a CONTROL signal from the computing system 33 and the output signal from demodulator 44. This CONTROL signal provides a setpoint level determining the vibration amplitude at which the probe tip 14 is operated. The correction signal from comparison circuit 46 is applied as an input to an integrator 54, which is used to cause the cancellation of small errors occurring rapidly in opposite directions in the correction signal. The output of integrator 54 is provided as an input to a switching circuit 57.

During lateral movement of sample 12, switching circuit 57 applies this input from integrator 54 to the position control driver circuit 32, causing the position control driver electrode segment to move the probe tip 14 as required to maintain the output at a level corresponding to the CONTROL signal provided as an input to the comparison circuit 46 from the computing system 33. That is, if the amplitude signal from demodulator 44 is too high, the probe tip 14 is lowered; if the amplitude signal is too low, the probe tip is raised. The other signal applied to the segmented piezoelectric actuator 16 is derived from the output of oscillator 34, which is passed through a variable-gain amplifier 36., which transmits the vibration signal from oscillator 34.

The output of integrator 54 is also applied through an analog-to-digital convertor 58. At the end of each lateral movement of the sample 12, the computing system 33 samples the output of this convertor 58 to determine the voltage being applied to vertical driver 22. Since this voltage indicates the deflection achieved within the piezoelectric actuator 16, and since this actuator 16 is being driven during lateral movement of the sample 12 through a servo loop to maintain a pre-determined level of engagement with the sample surface 10, the Z-position data from analog-to-digital convertor 58 provides an accurate description of the level of sample surface 10 at the end of lateral movement. Since the motion of probe tip 14 resulting from the drive signal applied to driver 22 and the motion of probe tip 14 resulting from the drive signal applied to driver 23, are added within the vertical actuator 16, the output of analog-to-digital convertor 58 describes a center line of vertical motion, to which vibratory motion is added.

Computing system 33 includes an internal random access memory 60 in which the data resulting from various measurements is stored. At the end of each movement of sample 12, the present value from analog-to-digital convertor 58 is stored to indicate the topographical height of the sample at the current data point. The computing system 33 also controls the lateral scanning movement of the sample 12 along a plane perpendicular to the vertical directions of arrow 19, by providing input signals to lateral motion driver 30 through a digital to analog convertor 62. In general, this lateral movement occurs in two directions which are perpendicular to one another, so the lateral motion actuator 29 provides movement in these two directions.

Each movement of the sample 12, performed as described above, is followed by a measurement of the force field gradient at a sampling point, with the probe point preferably continuing to be vibrated about the center of vibration resulting from servo operation with the device as an atomic force microscope at the end of the sample movement preceding the sample point. In terms of the exemplary apparatus of FIG. 1, this means that the positioning signal from integrator 54, which is used to drive vertical positioning driver 23, being digitized in analog-to-digital convertor 58, and stored in the data memory 60 of computing system, is used as Z-position data input to Z-position driver 23 during the process of sampling force field data. This operating mode is achieved through the operation of switching circuit 57 in accordance with the MODE SIGNAL, with the input to driver 23 being connected to the output of a digital to analog convertor 66 during the process of sampling force field data and to the output of integrator 54 during the movement of sample 12.

In accordance with the present invention, during the process of sampling force field data, the probe tip 14 is held out of contact with the sample surface 10, the probe tip 14 is vibrated at a substantially lower amplitude than in the determination of force field data, and the center of the peak-to-peak pattern of vibration is at the same level as during the first scan. To provide the desired reaction to the magnetic field being investigated, the probe tip 14 is composed of, or coated with, a ferromagnetic material which is magnetized to provide a pole of either north or south polarity at the apex of the tip. As described above in the Prior Art section, Roland Wiesendanger, in *Scanning Probe Microscopy and Spectroscopy—Methods and Applications*, Cambridge University Press, 1994, on pages 253–256, describes a processes which may be used to produce a tip of this kind.

The gain of amplifier 36 is varied from a high level to a low level at each measurement point through the operation of a switching circuit 67 in response to the MODE SIGNAL from computing system 33. When the sample 10 is being laterally moved, the switching circuit 67 directs the feedback loop of amplifier 36 through a first feedback circuit 68. When the apparatus is sampling force field data, the switching circuit 67 directs the feedback loop of amplifier 36 through a second feedback circuit 70. The difference in reactance, i.e. resistance and capacitance, between the feedback circuits 68, 70, is sufficient to cause a variation in the gain of the amplifier 36, so that the amplitude of the vibration signal driving the excitation driver circuit 22 is substantially greater during lateral movement of the sample 12 than during force field measurement.

During the measurement of force fields, the amplitude level of probe tip vibrations measured within demodulator 44 and provided as an input to the computing system 33 through analog-to-digital convertor 58 is used, in a manner discussed below in reference to FIGS. 4 and 5, to determine the direction and strength of magnetic fields extending outward from the sample surface 10.

Figure 2:
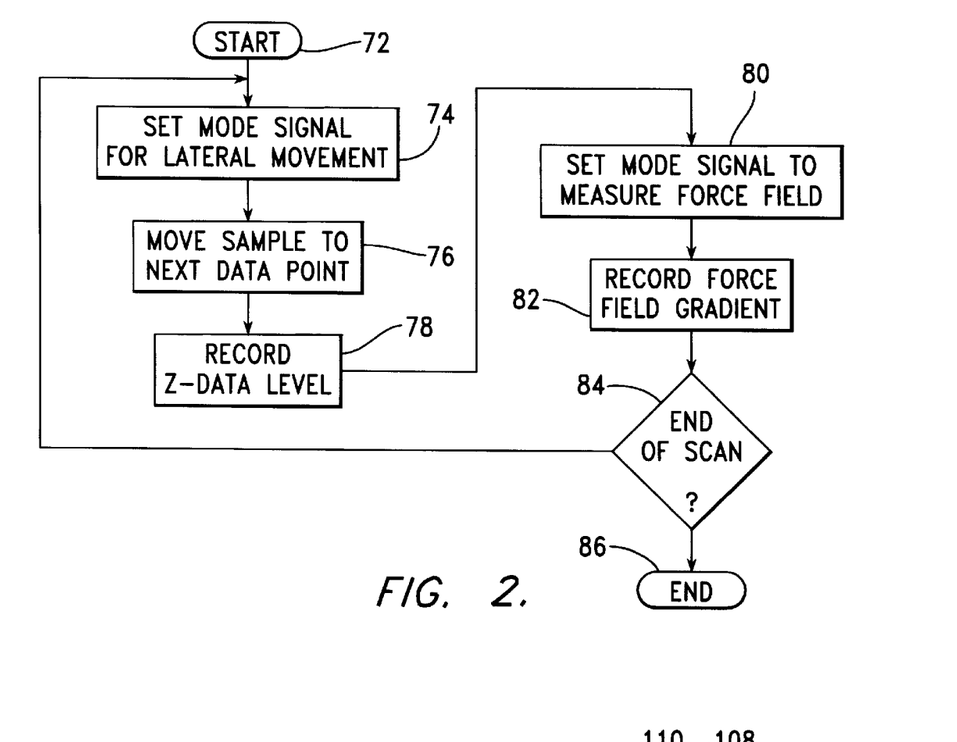
FIG. 2 is a flow chart showing operation of the apparatus of FIG. 1.

FIG. 2 is a flow chart showing operation of the apparatus of FIG. 1 in accordance with the present invention. Referring to FIGS. 1 and 2, within the computing system 33, a subroutine is operating to control the various steps of the process inspecting sample surface 10 for both topographical characteristics and for a magnetic field extending outward from the surface 10. This routine starts in block 72. Next, in block 74, the MODE SIGNAL is set for lateral movement of the sample 12, causing the operation of switch 67 to hold variable gain amplifier 36 in is high gain mode, with a large-amplitude excitation signal being provided as an input to excitation driver 22, and causing the operation of switch 57 to connect the input of vertical positioning driver 23 to the output of integrator 54, enabling operation of the servo system causing the vibrating probe tip 14 to follow topographical changes in the sample surface 10. Next, in block 76, the sample 12 is moved to the next point at which data is to be taken. When this point is reached, in block 78, the z-data level, i.e. the encoded signal from analog-to-digital convertor 58, is stored in data memory 60 of computing system 33.

Next, in block 80, the MODE SIGNAL is set to measure a force field, causing the operation of switch 57 to hold variable gain amplifier 36 in its low gain mode, with a low-amplitude excitation signal being provided as an input function to excitation driver 22, and causing the operation of switch 57 to connect the input of vertical positioning driver 23 to the output of digital-to-analog convertor 66. The input to this convertor 66 is the encoded data which has been stored in block 78, so the input voltage to the vertical positioning driver 23 remains at the same level. Next, in block 82, after allowing the vibrating system to stabilize with the lower-amplitude excitation input through driver 22, the computing system samples the output of analog-to-digital convertor 58, which now provides an output indicating the gradient of a force field in which the probe tip 14 is vibrating. The encoded signal from this convertor 58 is now recorded within the data memory 60 as data representing the magnetic field.

Next, in block 84, a determination is made of whether the scan is completed. If it is not completed, i.e. if there are more data points at which sample values are to be taken, the subroutine returns to block 74, from which the process described above is repeated, beginning with setting the MODE SIGNAL for lateral movement, and moving the sample 12 until the next data point is adjacent the probe tip 14. This process is repeated until the scan is completed, as indicated in block 84, allowing the subroutine to end in block 86.

Figure 3:
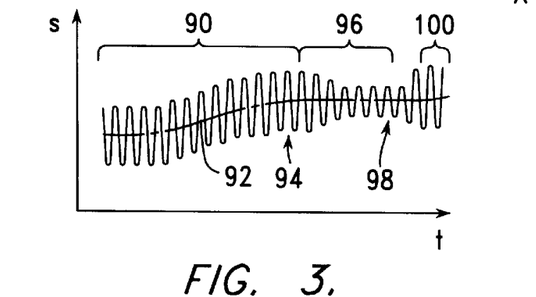
FIG. 3 is a graphical view of the motion of the probe tip of the apparatus of FIG. 1, as a function of time, in accordance with a first version of the present invention.

FIG. 3 is a graphical view of the motion (s) of probe tip 14 as a function of time (t), with the apparatus of FIG. 1 operating as shown in FIG. 2. Referring to FIGS. 1–3, during a first time period 90, the sample 12 is moved laterally, as probe tip 14 is vibrated, with a large-amplitude excitation function being applied through the excitation driver 22. As described in reference to FIG. 1, the center line 92 of this vibration is moved to follow topographical features of the sample surface 10. At a first sampling time 94, the lateral motion of the sample 12 is stopped, and the value stored in analog-to-digital convertor 58 is read into the computing system 33 to be stored in data memory 60 as a z-position data point.

During the second time period 96, the sample 12 is held stationary, as the input signal to lateral motion driver 30 is maintained at the same level. The input signal to vertical positioning driver 23 is also maintained at the same level, so that the vertical position of center line 92 is also maintained, and the probe tip 14 is vibrated with a small-amplitude excitation function being applied through the excitation driver 22. After allowing time for the vibrating system to settle out, approaching steady-state operation in response to small-amplitude excitation, at a second sampling time 98, the value at analog-to-digital convertor 58 is read into the computing system 33 to be stored in data memory 60 as a force field gradient data point. When this value from convertor 58 is taken, the probe tip is vibrating out of contact with sample surface 10, due to the reduction in tip vibration amplitude from the larger amplitude occurring during first time period 90.

Next, at the end of second time period 96, the probe tip 14 is vibrated with a large-amplitude excitation function being applied through the excitation driver 22. After allowing time for the vibrating system to settle out, approaching steady-state operation in response to large-amplitude excitation, during a third time period 100, both lateral motion of the sample 12 and servo operation to control the position of center line 92 are restored, providing continuing operation as described above in reference to first time period 90, as the sample 12 is laterally moved so that the next data point is adjacent the probe point 14.

Figure 4:
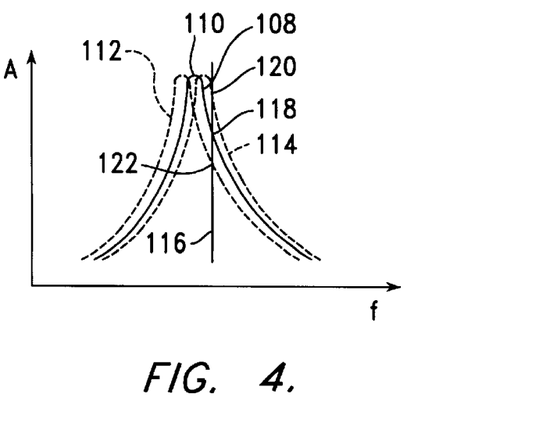
FIG. 4 is a graphical view of the amplitude of vibrations of the probe tip within the apparatus of FIG. 1 under conditions of a varying force field.

FIG. 4 is a graphical view of the effect of a force field having a gradient extending outward from sample surface 10 on the vibration response of a vibrating system, including the cantilever 18 and probe tip 14, to a constant-amplitude vibration input from the vertical actuator 16 (all shown in FIG. 1). This type of force field is established, for example, through the use of a magnetized probe tip moved adjacently above, but out of contact with, the sample surface 10, below which lie a number of magnetized regions. If, for example, a probe tip 14 magnetized to have a north pole extending downward moves over a region magnetized as a south pole, an attractive force field is encountered, with the probe tip 14 being pulled toward the sample surface 10. If such a probe tip 14 moves over a region magnetized as a north pole, a repulsive force field is encountered, with the probe tip 14 being pushed away from the sample surface 10. In either case, the magnitude of the force field increases as the probe tip 14 approaches the sample surface 10.

In FIG. 4, the resulting amplitude of tip vibration (A) is shown as a function of the excitation frequency (f). The central curve 108 shows the frequency response of the system consisting of the cantilever 18 with the probe tip 14 attached thereto in the absence of a force field, with a maximum amplitude of vibrations occurring at a resonant frequency 110. In an attractive force field, with the probe tip being pulled toward the direction of increasing force, the resonant frequency of the system is lowered, as indicated by curve 112. In a repulsive force field, with the probe tip being pushed in the direction of decreasing force, the resonant frequency of the system is raised, as indicated by curve 114.

The excitation frequency from oscillator 34 preferably occurs at an excitation frequency 116 outside the range of resonant frequencies of the vibrating system caused by the force field gradients to be encountered during the testing process. Otherwise, it is possible to have a probe tip amplitude of vibration caused by either an attractive force field or by a repulsive force field. In the example of FIG. 4, the excitation frequency is somewhat above the resonant frequency. Under these conditions, a frequency response having a median amplitude 118 is understood to be a result of vibration of the probe tip 14 in the absence of a force field gradient, a frequency response having an amplitude 120 greater than the median amplitude 118 is understood to be a result of vibration of the probe tip 14 in a repulsive force field, and a frequency response having an amplitude 122 less than the median amplitude 118 is understood to be a result of vibration of the probe tip 14 in an attractive force field. The level of the vibration amplitude above or below the median amplitude 118 is also a reflection of the level of the force field gradient.

Referring again to FIG. 1, in a first alternative embodiment of the present invention, the force field gradient is measured, with lateral motion of the sample 12 stopped, by determining the phase angle between the probe tip vibrations and the vibration excitation signal driving the actuator 16. These vibrations are at a lowered amplitude for sampling the force field as shown in FIG. 3. Thus, a first alternative version of the apparatus includes additional elements shown in FIG. 1 with dashed lines, adding a phase detector 120, which is provided with input signals composed of the vibration excitation signal used to drive excitation driver 22 and the output signal from laser detector 40. The phase detector 120 produces a signal indicating the phase difference between the excitation signal to driver 22 and the probe tip vibration measured by laser detector 40. During the measurement of a force field gradient, the computing system 33 accepts this phase angle data from the phase detector 116 for computation, transmission, and/or storage within the data memory 60.

Figure 5:
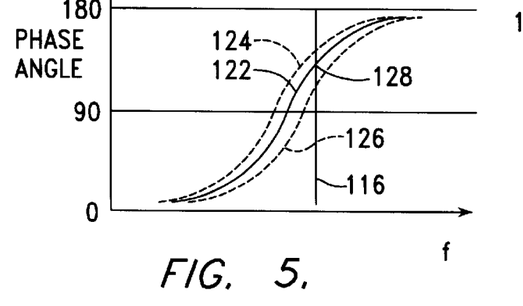
FIG. 5 is a graphical view of the phase angle of vibrations of the probe tip within the apparatus of FIG. 1, with respect to the excitation function driving such vibrations, under conditions of a varying force field.

FIG. 5 is a graphical view of the effect of force field gradients on the phase angle relationship between the excitation signal driving excitation driver 22 and the vibration of probe tip 14. Referring to FIGS. 1, 4, and 5, the displacement of the three curves in FIG. 5 reflects the displacement of the resonant frequency due to a force field gradient, as discussed above in reference to FIG. 4. Each of the phase angle curves in FIG. 5 asymptotically approaches an angle of zero degrees as the frequency approaches zero and an angle of 180 degrees as the frequency becomes very high, with the probe tip 14 vibration in all cases lagging the excitation signal. Under each condition of force field, when the excitation signal is at the resonant frequency of the vibrating system, including the probe tip 14 and cantilever 18, the phase angle is at 90 degrees. Thus, the central phase angle curve 118 represents the response of this vibrating system in the absence of a force field. In an attractive force field, the resonant frequency is reduced, causing the phase angle to vary as shown by curve 124. In a repulsive force field, the resonant frequency is increased, causing the phase angle to vary as shown in curve 126.

Phase angle measurements are made with excitation at a constant frequency, represented by line 116, being applied through excitation driver 22. This constant frequency may be at or near the resonant frequency of the vibrating system in the absence of a force field. An increase in the measured phase angle above the phase angle 128 measured in the absence of such a field indicates an attractive force, while a decrease in the this measured phase angle below this phase angle 128 indicates a repulsive force. The distance between the measured phase angle and the phase angle 128 also indicates the magnitude of the force field gradient.

The preceding discussion has described the use of the present invention to measure the external fields produced by magnetic regions within the sample 12. The present invention may also be used for other purposes, such as measuring the external fields caused by electrically charged regions in the sample.

Figure 6:
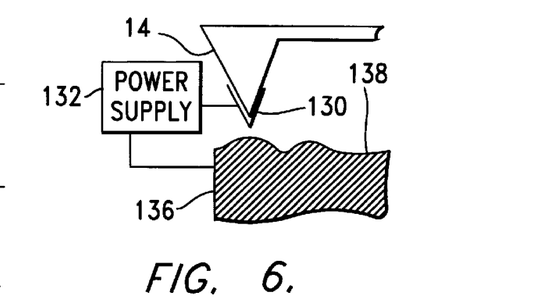
FIG. 6 is a schematic view of modifications to the probe tip within the apparatus of FIG. 1 to facilitate measurements of an electric field.

FIG. 6 is a schematic view of modifications applied to the probe tip 14 to facilitate the measurement of electric field. A conductive covering 130, placed over the tip 14 is connected to a power supply 132. The other terminal of power supply 132 is electrically connected to the sample 136, so that an electrical potential is applied to the conductive coating 130 relative to the sample 136. Depending on the nature of the sample 136, the power supply 104 may be attached, for example, to a internal or external conductive plane of the sample. Since opposite-signed charges attract, while like-signed charges repel one another, this configuration establishes a force field having gradients diminishing the level of force with movement away from the sample surface 138. Thus, the results described above in reference to FIG. 4 and 5 are found, and the directions and levels of the force fields are determined as described above.

Figure 7:
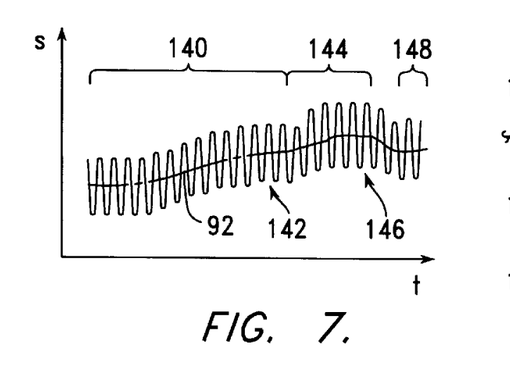
FIG. 7 is a graphical view of the motion of the probe tip of the apparatus of FIG. 1, as a function of time, in accordance with a second alternative version of the present invention.

FIG. 7 is a graphical view of the motion (s) of probe tip 14 as a function of time (t), in accordance with a second alternative version of the present invention. In this version, the probe tip 14 is vibrated with an excitation function having a constant amplitude and frequency throughout the process of sample movement and force field gradient measurement. Referring to FIGS. 1 and 7, in this second alternative version, the variable gain feature of amplifier 36 is not required. In the exemplary implementation of FIG. 1, there is no need for the switching circuit 67 and for different feedback paths, through reactances 68, 70. In this second alternative version, the vibrating probe tip 14 is moved out of contact with the sample surface 10

Referring to FIGS. 1 and 7, during a first time period 140, the sample 12 is moved laterally, as probe tip 14 is vibrated, with a large-amplitude excitation function being applied through the excitation driver 22. As described above in reference to FIG. 1, the center line 92 of this vibration is moved to follow topographical features of the sample surface 10. At a first sampling time 142, the lateral motion of the sample 12 is stopped, and the value stored in analog-to-digital convertor 58 is read into the computing system 33 to be stored in data memory 60 as a z-position data point.

During the second time period 144, the sample 12 is held stationary, as the input signal to lateral motion driver 30 is maintained at the same level. The input signal level to vertical positioning driver 23 is increased by an offset voltage sufficient to prevent contact between the probe tip 14 and sample surface 10, as the same large amplitude signal is applied to excitation driver 22. This offset voltage has been chosen while considering an amplitude increase as the vibrating probe tip 14 is brought out of contact with the sample surface 10. Within computing system, 33 a new value for a z-position data is calculated by adding this offset voltage to the z-position data value stored most recently in data memory 60.

After allowing time for the vibrating system to settle out, approaching steady-state operation in response to the new vertical height, at a second sampling time 146, the value at analog-to-digital convertor 58 is read into the computing system 33 to be stored in data memory 60 as a force field gradient data point. When this value from convertor 58 is taken, the probe tip is vibrating out of contact with sample surface 10, due to the application of the offset voltage.

Next, at the end of second time period 144, the probe tip 14 is vibrated with a large-amplitude excitation function being applied through the excitation driver 22, and with the centerline of vibration being returned, through the use of After allowing time for the vibrating system to settle out, approaching steady-state operation in response to large-amplitude excitation about a new center, during a third time period 148, both lateral motion of the sample 12 and servo operation to control the position of center line 92 are restored, providing continuing operation as described above in reference to first time period 90, as the sample 12 is laterally moved so that the next data point is adjacent the probe point 14.

In the related application which has issued as U.S. Pat. No. 5,907,096, apparatus similar or identical to that described above in reference to FIG. 1 is used to obtain both topographical data representing a sample surface and representing a force field extending outward from the sample surface. This application describes the use of this apparatus as a scanning force microscope driven in first and second passes along a scan line, with topographical features of a sample surface being determined during a first scan as an atomic force microscope, and with a magnetic or electric field being measured during the second pass. Topographical data from the first pass is used to move a probe tip at a constant displacement from the sample surface during the second pass, in which contact between the probe tip and the sample surface is prevented by reducing the amplitude of tip vibrations.

In a third alternative version of the present invention, the apparatus of FIG. 1 is alternatively used in a first mode as described above in reference to FIGS. 1–7 and in a second mode as described in detail in U.S. Pat. No. 5,907,096. That is, a force field extending outward from the sample surface 10 is either measured at sample points taken along a scan line during a single pass, or force field data is taken during a second pass along a scan line, after topographical data is collected during the first pass along the same scan line. Operation in the first or second mode occurs under the control of a subroutine operating in computing system 33, having been loaded into an instruction memory therein by one or more magnetic disks 150. The determination of which mode is used may be operator selectable through a choice made in response to a menu displayed on display unit 151.

Figure 8:
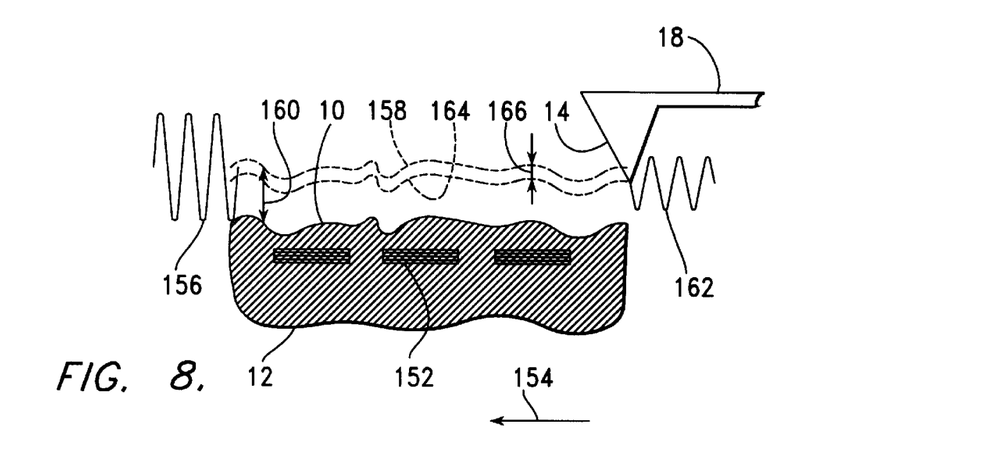
FIG. 8 is a vertical cross-sectional view of a sample being examined within the apparatus of FIG. 1, together with a graphical view of movement of a probe tip within the apparatus of FIG. 1 in accordance with a second mode of operation within a third version of the present invention.

FIG. 8 is a vertical cross-sectional view of the sample 12, schematically showing the relative vertical movement of probe tip 14 associated with the first and second lateral scanning passes of the sample 12 in the second mode of operation of the third alternative version of the present invention. Referring to FIGS. 1 and 8, the sample 12 includes a surface 10 being examined and a number of magnetized ranges 152 lying under the surface 10. During the first pass, sample 12 is moved in the direction of arrow 154, while a vibration pattern 156 is applied to the probe tip 14. As described in reference to FIG. 1, the center of the vibration of the probe tip follows the topography of the surface 10 along a line 158, being displaced above the surface 10 by a pre-determined distance 160. During the second pass, sample 12 is moved opposite the direction of arrow 154 while a vibration pattern 162 is applied to the probe tip 14. The line 164 representing the center of vibration of the probe tip 14 during the second pass is displaced downward from the former center line 158 through a differential displacement distance 166.

The accurate measurement of the magnetic field associated with subsurface magnetic regions, such as regions 152, requires the second pass measurement to be made with the probe tip 154 being moved out of contact with the sample surface 10, but with the center line of vibration being moved at a fixed distance from the sample surface 10. In particular, contact between the probe tip 14 and the sample surface 10 causes signals from topographical features of the surface to become confused with signals due to magnetic fields. Also, moving the center of vibration away from the surface 10 results in a loss of spatial resolution. In accordance with the present invention, these conditions are met by significantly reducing the amplitude of vibrations with which the probe tip 14 is driven during the second pass. Using the present invention accomplishes both of these objectives through a reduction in the amplitude of the excitation frequency during the second pass, as indicated by a comparison of the patterns 162 and 156. With this reduction in vibration amplitude, the center 84 about which vibration occurs is moved toward the sample surface 10 without causing contact between the probe tip 14 and this surface.

In this way, a significant advantage, in terms of spatial resolution, is gained over prior art methods, in which the centerline of probe vibration is actually moved away from the sample surface. This advantage is particularly important in a number of commercially important applications having particularly small magnetized regions, producing outwardly extending fields which quickly fade with distance from the sample surface. While the above discussion has described the second-pass vibration center, indicated by line 164, as being moved downward relative to the first-pass vibration center, indicated by line 158, it is understood that these lines 158, 164 can be coincident while a significant advantage relative to the prior art is maintained, since clearance is established between the vibrating probe tip 14 and the sample surface 10 without a need to move the center of vibration upward for the second pass.

Magnetized regions within the sample 12, such as the regions 152, produce a magnetic field extending beyond the sample surface 10, with a relatively sharp gradient reducing the strength of the field with increasing outward distance from the surface 10. When a suitably small magnetized probe, such as probe tip 14, is placed in such a field, a force acts upon it, which is either attractive, pulling the probe in the direction of increasing field strength toward the sample surface 10, or repulsive, pushing the probe in the direction of decreasing field strength away from the sample surface. In this way a force field is created, with attractive or repulsive forces acting on the probe tip 14, and with these forces varying with the gradients established by the magnetic fields.

Referring to FIGS. 1, 4 and 8, the relationships between levels of vibration are understood to reflect conditions of actual tip motion, including the effects of resonance described in reference to FIG. 1. While a constant amplitude and frequency of vibration is applied to the actuator 20 during the second pass, the resulting amplitude of vibration of probe tip 14 is expected to vary with changes in the force field through which the probe tip 14 is moved. In accordance with the present invention, despite such variations, the resulting amplitude of tip vibrations during the second pass remains significantly less than the amplitude of tip vibrations occurring during the first pass, so that the probe can be moved through the second pass without the requirement of the prior art to raise the center of tip vibrations above its level in the first pass.

The preceding discussion has described the use of the present invention to measure the external fields produced by magnetic regions within the sample 12. The present invention may also be used for other purposes, such as measuring the external fields caused by electrically charged regions in the sample. In general, this method is applicable whenever a field, such as a magnetic or electric field, produces a field of forces acting on the probe as it is moved adjacent to the sample surface 10, so long as this resulting force field has a gradient with respect to a line extending outward from the sample surface.

The computing system 33 executes one or more subroutines, stored therein after being supplied in the form of a number of magnetically recorded disks 150. These subroutines control the operation of the apparatus of FIG. 1, during both the measurement of topographical data and during the measurement of force field data, and control the storage and conversion of data concerning sample topography and field strength.

Figure 9:
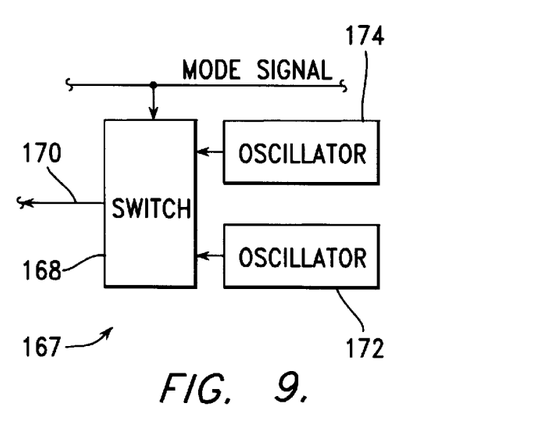
FIG. 9 is a fragmentary schematic diagram showing an alternative excitation signal circuit.

FIG. 9 is a fragmentary schematic diagram showing an alternative excitation signal circuit 167, which is used with other components described above, in reference to FIG. 1, to provide for separate excitation frequencies between the measurements of topographical features and force field gradients. In this alternative excitation signal circuit 167, a switch 168 connects an output line 170 to either a first oscillator 172 or a second oscillator 174 in accordance with the condition of the MODE SIGNAL. The output line 170 provides inputs to the excitation driver 22. In this configuration, the use of a variable gain amplifier 36, as described above in reference to FIG. 1, is not required, since the previously-described relationships between vibration amplitudes within the first and second passes can readily be obtained by adjusting the circuits of the oscillators 172,174.

Referring to FIGS. 1 and 9, with the device operating as an atomic force microscope to measure topographical features of the sample surface 10, maximum sensitivity to changes in topography is achieved when the excitation frequency is equal to the resonant frequency of the cantilever 18 with the probe 14 attached thereto. However, as described above in reference to FIG. 4, when the device is used to measure a force field gradient by means of measuring variations in the amplitude of probe vibration, the excitation signal to driver 22 must be at a frequency somewhat above or somewhat below the resonant frequency, in order to make it possible to determine the direction of the force field gradient causing a change in tip vibration amplitude, and in order to maximize the level of amplitude change caused by a change in the force field gradient. The excitation frequency during force field measurements is preferably outside a range of resonant frequencies which may be encountered during process of measuring force field gradients. Thus, with measurements during both first and second passes being made using variations in the probe amplitude, maximum levels of sensitivity are obtained with the alternative signal excitation circuit 167 being used provide an input signal to the driver 22 at the resonant frequency during the first pass and at a level somewhat above or below the resonant frequency during the second pass.

While the present invention has been described in its preferred forms or embodiments with some degree of particularity, it is understood that this description has been given only by way of example and that numerous changes in the details of construction, fabrication and use, including the combination and arrangement of parts may be made without departing from the spirit and scope of the invention. For example, while the vertical actuator moving the probe has been shown to be a segmented bimorph piezoelectric actuator having the vibration excitation signal applied to a one segment of a segmented electrode, while the positioning signal is applied to the other segment thereof, the invention may alternately applied through the use of another type of actuator, which is driven by a signal comprised of a sum of a position signal and a vibration signal.

What is claimed is:

1. Apparatus for measuring topographical features of a sample surface and a force field extending outward therefrom, wherein said apparatus comprises:

a cantilever having proximal and distal ends;

a probe tip mounted at said distal end of said cantilever;

lateral drive means creating intermittent relative scanning motion between said probe tip and said sample surface, along a scan line on said sample surface, wherein said probe tip and said sample surface are held during a sampling period with said probe tip adjacent each sampling point within a plurality thereof along said scan line, between said relative scanning motion along said scan line;

vertical drive means causing relative motion between said probe and said sample surface along a Z-axis perpendicular to said sample surface, in accordance with a position signal applied to said vertical drive means;

excitation drive means vibrating said proximal end of said cantilever;

a vibration detector detecting amplitudes of vibrations of said probe tip;

control means generating said position control signal in accordance with a correction signal determined from an output of said vibration detector to maintain a constant level of engagement between said probe tip and said sample surface during said relative scanning motion, with said control means generating said position control signal and operating said excitation drive means to vibrate said probe tip out of engagement with said sample surface during each said sampling period; and data storage means storing, for each said sampling point, a first value determined from said position control signal with said probe being vibrated in engagement with said sample surface, and a second value determined from an output of said vibration detector with said probe being vibrated out of engagement with said sample surface, with said first value indicating a topographical level of said sample surface, and with said second value indicating a condition of said force field.

2. The apparatus of claim 1, wherein, during each said sampling period, said control means generates said position control signal at a constant value equal to the value for said position control signal at an end of said relative scanning motion preceding said sampling period, and said control means operates said excitation drive means to vibrate said probe tip at an amplitude sufficiently small to hold said probe tip out of engagement with said sample surface.

3. The apparatus of claim 1, wherein, said control means operates said excitation drive means to vibrate said proximal end of said cantilever at a predetermined amplitude during each said relative scanning motion and during each said sampling period, and during each said sampling period, said control means generates said position control signal at a constant value equal to the value for said position control signal at and end of said relative scanning motion preceding said sampling period, together with an offset value sufficient to prevent engagement of said probe tip with said sample surface.

4. The apparatus of claim 1, wherein said second value is determined from an amplitude of vibration of said probe tip detected by said vibration detector.

5. The apparatus of claim 4, wherein a resonant frequency of said cantilever with said probe tip attached thereto varies within a frequency range as gradients of said force field are measured, said excitation drive means vibrates said proximal end of said cantilever at a first frequency equal to a resonant frequency of said cantilever with said probe tip attached thereto in an absence of a force field gradient as said probe tip is vibrated in engagement with said sample surface, with said first frequency being within said frequency range, and said excitation drive means vibrates said proximal end of said cantilever at a second frequency outside said frequency range as said probe tip is vibrated out of contact with said sample surface.

6. The apparatus of claim 1, wherein said vibration detector also detects a phase angle difference between vibrations of said probe tip and vibrations of said excitation drive means, and said second value is determined by said phase angle difference.

* * * * *